United States Patent
Zubia Urrutia (10) Patent No.: US 9,488,495 B2
(45) Date of Patent: Nov. 8, 2016

(54) SYSTEM, METHODS, DEVICE AND NON-TRANSITORY COMPUTER READABLE STORAGE MEDIUM, FOR IDENTIFYING CONNECTIVITIES IN ELECTRICAL NETWORKS

(71) Applicant: ARIADNA INSTRUMENTS, S.L., Leioa (Vizcaya) (ES)

(72) Inventor: Haritz Zubia Urrutia, Leioa (Vizcaya) (ES)

(73) Assignee: ARIADNA INSTRUMENTS, S.L., Leioa (Vizcaya) (ES)

( * ) Notice: Subject to any disclaimer, the term of this patent is extended or adjusted under 35 U.S.C. 154(b) by 95 days.

(21) Appl. No.: 14/569,704

(22) Filed: Dec. 13, 2014

(65) Prior Publication Data

US 2015/0097699 A1    Apr. 9, 2015

Related U.S. Application Data

(63) Continuation-in-part of application No. PCT/ES2012/070446, filed on Jun. 15, 2012.

(51) Int. Cl.
| | |
|---|---|
| *G08B 23/00* | (2006.01) |
| *G01D 4/00* | (2006.01) |
| *H02J 13/00* | (2006.01) |
| *G01R 21/133* | (2006.01) |

(52) U.S. Cl.
CPC ........... *G01D 4/002* (2013.01); *H02J 13/0006* (2013.01); *G01R 21/133* (2013.01)

(58) Field of Classification Search
None
See application file for complete search history.

(56) References Cited

U.S. PATENT DOCUMENTS

| | | | | |
|---|---|---|---|---|
| 8,081,002 B2* | 12/2011 | Wahlroos | ............. | G01R 31/088 324/512 |
| 2006/0044117 A1 | 3/2006 | Al Farkas | | |
| 2009/0083019 A1* | 3/2009 | Nasle | ................... | G06F 17/509 703/18 |
| 2009/0189774 A1 | 7/2009 | Brundridge | | |
| 2010/0007219 A1 | 1/2010 | De Buda | | |

FOREIGN PATENT DOCUMENTS

| | | |
|---|---|---|
| WO | WO 2012/139658 A2 | 10/2012 |
| WO | WO 2013/186404 A1 | 12/2013 |

* cited by examiner

*Primary Examiner* — Adolf Dsouza
(74) *Attorney, Agent, or Firm* — Hess Patent Law Firm; Robert J. Hess (57) ABSTRACT

A system, method, device and non-transitory computer-readable storage medium, for identifying connectives in electrical networks are provided. The system has a first current sensor and a first clock for detecting events defined as changes in a magnitude of a passive electric current circulating through an electrical load point, and the time between events; a second current sensor and a second clock for detecting events defined as changes in a magnitude of a passive electric current circulating through a distribution line and/or through a supply point connected thereto, and the time between event; and a processor and a memory to compare the time between the events detected by the first current sensor an first clock with the ones detected by the second event current sensor and second clock, to determine at which distribution line the load point is connected to.

16 Claims, 5 Drawing Sheets

SYSTEM, METHODS, DEVICE AND NON-TRANSITORY COMPUTER READABLE STORAGE MEDIUM, FOR IDENTIFYING CONNECTIVITIES IN ELECTRICAL NETWORKS

The present application is a bypass continuation-in-part of U.S. application of currently pending international application No. PCT/ES2012/070446 having an international filing date of Jun. 15, 2012 and designating the United States, the entire contents of the aforesaid international application being incorporated herein by reference.

FIELD OF THE ART

The present invention is included within the field of systems for the detection of loads connected to the electric power distribution network and more specifically in systems for determining connectivity data regarding the customers of the electrical network.

PRIOR ART

For efficient management of electricity distribution is necessary to know how the loads are connected to the electric power distribution network. This involves knowing the attributes or connection data of all customers/users of the electric companies, i.e. knowing to which substation, transformer center, transformer, phase and line is connected each. The connection data of the transformer, phase, line, transformer center and substation are called client connectivity data.

Although it may seem that the electrical networks are static elements, due to constant tasks for maintenance, restructuring, expansions and other changes, constantly alterations are performed in their structure or in the connection of elements (loads, transformers, etc.) to the network. For example, when a breakdown occurs is usual to rehire the affected branch with a new back branch, and in the absence of reversing the change in the network, the network structure has changes that cannot be registered and therefore connectivity data change.

A detailed and updated knowledge of the connectivity data enables management systems of the electric companies:
Simulate loads per transformer, line and phase
Identify technical and non-technical losses in power supply
Determine points of connection of new customers, based on network availability
Find trouble spots before incidents occur
Generate dummy traces knowing the connectivity and geographical location of customers
Identify which customers should be compensated because of incidents in the quality of power supply
Portable equipment for the identification of electric cables, both in networks with voltage and in networks without voltage, which allow specific detection of connectivity data are known in the market.

All existing systems are based on the injection and subsequent detection of "active" current signals flowing through the electrical network itself.

To that end, those systems require a generator of active signals, connected to the client side (network load), and one or more sensors for detecting signals in the network side where you want to see if the client is connected, generally in the line of the transformer that electrically feeds that client.

These systems, while being effective for specific detection of data connectivity, have the disadvantage that they cannot be implemented permanently in electricity networks, as the signal generator should be installed within or associated with the power meter of each client, making it more expensive and complicating its installation.

In addition, with a portable system, it is sufficient to use a single generator to identify connectivity of multiple clients successively, but in a fixed installation a transmitter per client to be monitored must be installed, so that the order of magnitude of necessary equipment grows in an exaggerated manner.

There are also permanent systems that taking advantage from the transmission and subsequent detection of communication signals of power consumption meters by the network itself, called PLC signals (PLC: Power Line Communication), measure at the electric company transformer the PLC signal amplitude at the different output lines connected to the transformer, assuming that the largest amplitude corresponds to the wire that supplies power to meter that injects the PLC signal and whose connectivity is investigated.

This technology has the disadvantage that, because of the frequency characteristics of the PLC signal used (30 kHz-90 kHz), its flow path does not always correspond to the flow path of electricity. This is so because these signals tend to spread through ground to different electrical conductors, being detected in other electrical circuits, and even in networks of other supply companies, such as in metal water pipes, telephone cables, gas cables, etc.

This produces that the cable containing the largest PLC signal amplitude does not always corresponds to the cable which is really connected to the power meter of a particular customer.

Furthermore, as that system is a detection system looking for maximum signal, if the cable through which a greater amount of signal circulates a sensor to measure that signal is not arranged or that sensor is damaged, the system can erroneously link connectivity to the next cable through which a higher amount of signal circulates, thereby the connectivity misidentifications rate also increases.

US 2006/044117A1 discloses an apparatus and a method for mapping components in a power system using a controller and a data collection system. The controller is operable to transmit a first power system component ID for the first power system component, particularly a power distribution unit (PDU) power supplying several second power system components, particularly computer systems, to one of said second computer systems. The data collection system is operable to receive from the computer system the PDU ID and an ID for the computer system. The data collection system is further operable to associate the PDU with the computer system based on the received IDs.

Additionally, US 2006/044117A1 discloses mapping the computer systems to respective breakers within the PDU, based on the power consumption at each component, particularly based on current measurements, specifically on the variation of current values at specific absolute times.

US 2006/044117A1 is silent about any proposal for mapping a plurality of computer systems to a breaker at a time, i.e. when all or some of the computer systems are connected to the same breaker and power supplied simultaneously. In that situation, the current sensed at the breaker would include the addition of the currents consumed by all those computer systems, making it impossible to discern to which computer a specific current value variation would belong to. This problem would be increased if, instead of applied to a computer network, the power system was an electrical power distribution network distributing electricity to a high number of clients whose connectivity data must be determined.

DISCLOSURE OF THE INVENTION

The present invention relates to a system, methods, device and non-transitory computer-readable storage medium, for identifying connectivities in electrical networks, which allow maintaining automatically updated connectivity data of the electric companies customers, that is, allow databases to reliably know to which transformer, distribution line (electrical circuit) and phase each client is connected.

To that end, unlike other existing systems on the market, according to the present invention no use of signals produced by a dedicated generator is made, i.e. the present invention is not based on the injection and subsequent detection of active signals in the network. Instead, it is based on recording, in different points, current-related events produced by the loads of the own customers whose connectivity is to be determined, identifying connectivity by detecting network passive signals. In the present description the term event is defined as an increase or decrease of a magnitude of electric current with respect to time in a point of the electrical network.

The present invention relates to a system for identifying connectivities in electrical networks, comprising:

first event detection means, including at least one current sensor and at least one clock, and configured and arranged for detecting at least two events defined as changes in a magnitude of a passive electric current circulating through an electrical load point of an electrical network, and the time between said at least two detected events, second event detection means, including at least one current sensor and at least one clock, and configured and arranged for detecting at least two events defined as changes in a magnitude of a passive electric current circulating through at least one distribution line of said electrical network and/or through at least one supply point connected to said at least one distribution line to supply electricity therein, and the time between said at least two detected events, and connectivity checking processing means, having at least one processor and one memory (RAM and/or ROM), and having access to data provided by said first and second event means regarding said times between events, and being adapted to process said provided data, by means of program instructions executable by said at least one processor (and stored in said at least one memory of in another memory, which can be of a ROM or RAM type), to compare the time between the events detected by the first event detection means with the time between the events detected by the second event detection means, and to determine, based on similarity between said compared times, at which distribution line or distribution lines the electrical load point is electrically connected to.

The terms passive electric current refer to an electric current which has not been injected or made circulate into the network, with the purpose of performing the connectivity identification, to clearly distinguish the invention from the above mentioned systems based on the injection and subsequent detection of active current signals and also from any other system which actively forces the consumption of a load to follow a specific pattern. Instead, a passive electric current is a current associated to an unforced power consumption of a load.

For an embodiment of the system:

said first event detection means are configured and arranged for detecting a plurality of said events at said electrical load point of an electrical network, and the time pattern followed by said plurality of detected events, said second event detection means are configured and arranged for detecting a plurality of said events at said at least one distribution line of said electrical network and/or at said at least one supply point connected to said at least one distribution line, and the time pattern followed by said plurality of detected events, and said connectivity checking processing means have access to data provided by the first and second event means regarding said time patterns, and are adapted to process said provided data with said at least one processor, to compare said time patterns to determine, based on similarity between said compared time patterns, at which distribution line or distribution lines the electrical load point is electrically connected to.

For another embodiment of the system of the invention:

the first event detection means are configured and arranged for detecting a plurality of said events at each of several electrical load points of an electrical network, and the time patterns followed by said pluralities of detected events, the second event detection means are configured and arranged for detecting a plurality of said events at each of one, two or more distribution lines of the electrical network and/or supply points connected to said distribution lines, and the time patterns followed by said pluralities of detected events, and said connectivity checking processing means have access to data provided by the first and second event means regarding said time patterns (for example, in the form of event tables including events time patterns), and are adapted to process said provided data, with said at least one processor, to compare said time patterns to determine, based on similarity between said compared time patterns, at which distribution line or distribution lines each of the electrical load points is electrically connected to.

For an embodiment, the first and second event detection means are adapted to send the above mentioned data regarding said times between events or time patterns to the connectivity checking processing means via communication links, wired or wireless, using any type of appropriate technology, such as: PLC, radio, telephony. ADSL, optical fiber, etc. Alternatively, said data can be collected in situ by an operator and delivered to the checking processing means, which can be implemented in a portable computing device, such as a smart phone, a tablet or a laptop computer, carried by the operator itself, or implemented by a remote computer.

This comparison can be done with an automatic element in the electrical network, i.e. an element with processing capabilities having at least one processor and one memory and also with communication capabilities to receive the above mentioned event tables and process the data included therein (by a computer program or application executable by the at least one processor) to generate a connectivity report or connectivity database including the connectivity data already analyzed, by means of said data processing, and then sending the connectivity report or connectivity database to a remote location, such as the central office of the electrical company supplying electricity through the mentioned distribution lines, or, alternatively, the above mentioned comparison can be done at said central office itself, also automatically by corresponding a computer unit.

I.e. the connectivities are determined by correlating the event time patterns of the loads with those of the distribution line or supply point. Therefore, the magnitudes of the events whose time patterns are compared do not need to be the same or similar to each other, as only their event temporal sequences must be equal or similar to each other in order to correlate them. By the comparison of time patterns, a more reliable connectivity identification is performed, compared to the prior art proposals, particularly when a plurality of loads are connected to and supplied by the same distribution network.

According to an embodiment, the system of the present invention is applied to an electrical distribution network which comprises coupled lines and/or ringed lines, wherein at least one of said electrical load points is connected to two or more of said coupled lines and/or ringed lines, and wherein the second event detection means are configured and arranged for detecting said plurality of events and time patterns between events at said two or more coupled lines and/or ringed lies.

For example, in a ringed network, a client can connect a load of, for example, 10 A, to a load point which can be connected to a first and a second distribution lines, receiving, for example, 8 A from one line and 2 A from the other. Hence, all the power consumption variations at that load point will keep that 8/2 rate.

For an embodiment, the second event detection means are configured and arranged for detecting said plurality of events at at least one supply point connected to the head end of the distribution line and at at least another supply point connected to an intermediate point of the same distribution line (such as a point at which the output of a generator or transformer is connected to). Thus, similarly to the above embodiment regarding ringed networks, the client in supplied at a load point from two or more electricity sources.

For a further embodiment, the first and second event detection means are configured and arranged to detect also the magnitude of the electric current adopted in each event, and the connectivity checking processing means are adapted to compare also the electric current magnitudes detected by the first event detection means with the electric current magnitudes detected by the second event detection means to determine, based on similarity between said compared electric current magnitudes, at which distribution line or distribution lines the electrical load point is electrically connected to.

For the system of the invention and also for the rest of aspects of the present invention (methods, storage medium and device), the changes in a magnitude of the electric current circulating which define said events are, for some preferred embodiments, at least one of: changes in their root mean square values and changes in their instantaneous values when longer than 1 ms, although any other magnitude changes which allow the event detection be performed are also possible.

According to an embodiment, the first event detection means comprise, per load point, a power consumption meter installed on the electrical load point (this meter can be the usual consumption meter of the user that is installed on the service entrance) or a load meter suitable to be coupled to a transformer of the electrical load point.

The second event detection means comprise, for an embodiment, an electric current meter which comprises a toroidal coil (for example, a Rogowsky coil) or a current transformer.

Any known current detection mechanism, and equivalents thereof, can be comprised and used by the first and second event detection means, of a contact (resistive sensors, etc.) or contactless type (such as current detection by inductive coupling, magnetic current sensing, etc.), the present invention not being limited to any specific current detection mechanism.

For an embodiment, the first event detection means and the second event detection means comprise, at each point at which they detect events and time patterns, memory storing means for storing in memory (such as an internal memory) the detected events together with corresponding timestamps indicative of the moments at which the events have occurred, said memory storing means being electrically connected to electronic circuitry including a microprocessor or equivalent (such as a logic circuit), included in the first and second event detection means, in connection also with the used current detection mechanism to acquire the current detected values, detect the magnitude changes between them (for example by means of an algorithm executed by the microprocessor or by means of electric/electronic circuitry including at least one comparator) and store them in memory.

Each of the first and second event detection means comprises, at each load point at which they are coupled to detect events and time patterns, a clock, said clocks being independent to each other (i.e. not synchronized to each other), to perform their respective detections of time or times between events.

The system of the invention is valid for medium voltage (MV) networks, wherein the above mentioned electrical load point is, in general, a distribution transformer, and for Low Voltage (LV) networks, wherein said electrical load point is a service entrance point.

The present invention also relates to a method for identifying connectivities in electrical networks, comprising:
detecting at least two events defined as changes in a magnitude of a passive electric current circulating through an electrical load point of an electrical network, and the time between said at least two detected events,
detecting at least two events defined as changes in a magnitude of a passive electric current circulating through at least one distribution line of said electrical network and/or through at least one supply point connected to said at least one distribution line to supply electricity therein, and the time between said at least two detected events, and
processing data regarding said times between events, to compare the time between the events detected at said electrical load point with the time between the events detected at said at least one distribution line of said electrical network and/or said at least one supply point connected thereto, and to determine, based on similarity between said compared times, at which distribution line or distribution lines the electrical load point is electrically connected to, where said data processing is performed by the execution of memory-loaded program instructions by at least one processor.

For an embodiment, the method of the invention comprises detecting also the magnitude of the electric current adopted in each event, and comparing also the electric current magnitudes detected at said electrical load point with the electric current magnitudes detected at said at least one distribution line of said electrical network and/or said at least one supply point connected thereto, to determine, based on similarity between said compared electric current magnitudes, at which distribution line or distribution lines the electrical load point is electrically connected to.

The method of the invention further comprises, for an embodiment, storing in memory the detected events together with corresponding timestamps indicative of the moments at which the events have occurred.

The present invention also relates to a computer-implemented method for identifying connectivities in electrical networks, comprising, by the execution of memory-loaded program instructions by at least one processor:

data regarding time or times between events defined as changes in a magnitude of a passive electric current circulating through an electrical load point of an electrical network, and data regarding time or times between events defined as changes in a magnitude of a passive electric current circulating through at least one distribution line of said electrical network and/or through at least one supply point connected to said at least one distribution line to supply electricity therein, to compare said time or times between events at said electrical load point with said time or times between events at said at least one distribution line of said electrical network and/or at said at least one supply point connected thereto, to determine, based on similarity between said compared times, at which distribution line or distribution lines the electrical load point is electrically connected to.

In another aspect, the present invention also relates to a non-transitory computer-readable storage medium containing program code for causing a computer to perform a method for identifying connectivities in electrical networks comprising processing:

data regarding time or times between events defined as changes in a magnitude of a passive electric current circulating through an electrical load point of an electrical network, and data regarding time or times between events defined as changes in a magnitude of a passive electric current circulating through at least one distribution line of said electrical network and/or through at least one supply point connected to said at least one distribution line to supply electricity therein, to compare said time or times between events at said electrical load point with said time or times between events at said at least one distribution line of said electrical network and/or at said at least one supply point connected thereto, and to determine, based on similarity between said compared times, at which distribution line or distribution lines the electrical load point is electrically connected to.

A further aspect of the invention relates to a device for identifying connectivities in electrical networks, comprising connectivity checking processing means having access to:

data regarding time or times between events defined as changes in a magnitude of a passive electric current circulating through an electrical load point of an electrical network, and data regarding time or times between events defined as changes in a magnitude of a passive electric current circulating through at least one distribution line of said electrical network and/or through at least one supply point connected to said at least one distribution line to supply electricity therein, wherein said connectivity checking processing means have at least one processor an one memory and are adapted to process said data, by means of program instructions executable by said at least one processor, to compare said time or times between events at said electrical load point with said time or times between events at said at least one distribution line of said electrical network and/or at said at least one supply point connected thereto, to determine, based on similarity between said compared times, at which distribution line or distribution lines the electrical load point is electrically connected to.

Another aspect of the invention relates to a device which comprises:

first event detection means which can be coupled to a load point of the electrical network, which can detect an event comprising a change in a magnitude of the electric current flowing though said load point, second event detection means which can be coupled to a line of the electrical network, which can detect an event comprising a change in a magnitude of the electric current flowing through said line, connectivity checking means comparing the events detected by the first event detection means with the events detected by the second event detection means for determining to which line corresponds the event that occurred on the load point, (I.e., when an event is detected at a load point, the same event must be detected in one of the lines that will be the line which power supplies, i.e. distributes electricity to, said load point).

In the present invention, the term load point refers to any connection point to a line of the electrical network that is connected to one or more loads of a user/customer (low voltage) or to one or more transformers (medium voltage).

As stated above, for some preferred embodiments the change in magnitude of the current can be a variation of the root mean square (RMS) value of the electric current or a change in the instantaneous value of the electric current with a duration exceeding 1 ms, In case of measuring the RMS value, a time window for the calculation of the RMS value is created. This time window can encompass one or several network cycles (50 Hz or 60 Hz). In this case, an event is characterized by a change in the RMS value, with an adjustable minimum change threshold (sensitivity), and a positive or negative sign depending on whether the change relates to an increase or a decrease in the RMS value.

In case of measuring instantaneous values, for example current surges, an event is defined as a change in current having a width greater than 1 ms. This minimum width (1 ms) is analyzed in order to exclude changes which could spread to other conductors that do not supply power to the point whose connectivity is investigated. The identifying instantaneous values are peak value, width, sign and chronological time (if it exists).

The first and second event detection means may include instant detection means for detecting the moment at which said event is produced (e.g. the network cycle at which the event occurs).

Another object of the invention a method for identification of connectivities in electrical networks comprising:

detecting an event that comprises a change in a magnitude of the electric current flowing in a load point of the electrical network, detecting an event that comprises a change in a magnitude of the electric current flowing in an electrical line, comparing changes in magnitude of the electric current detected at the load point of the network with changes in magnitude of the electric current detected in the electrical line to determine to which line corresponds the event occurred in the load point. (I.e., when an event is detected at a load point the same event must be detected in one of the lines that will be the line that power supplies, i.e. distributes electricity to, said load point).

The change in magnitude of the current can be a variation of the RMS value of the electric current or a change in the instantaneous value of the electric current with a duration exceeding 1 ms.

The method may comprise the detection of the moment at which the change in magnitude of the electric current occurs.

The method may comprise storing the detected changes in magnitude. This step would be performed before the step of comparison of magnitude changes in the electric current.

The present invention has the following advantages:
- identifies connectivity by the detection of passive network events, thus eliminating the need for a specific transmitter.
- identifies connectivity at the head end of the distribution network absolutely, without comparing amplitudes with other possible supply sources, thereby increasing reliability in the connectivity identifications.

BRIEF DESCRIPTION OF THE DRAWINGS

The foregoing and other advantages and features will be more fully understood from the following detailed description of several embodiments in reference to the attached drawings which must be interpreted in an illustrative and non-limiting manner, in which.

DETAILED DESCRIPTION OF SEVERAL EMBODIMENTS

The present invention allows recording network events, namely, events generated downstream of the point or points of installation of the corresponding components of the system of the invention. To that end, event detection means are used running an algorithm that detects several changes (increase or decrease) over time of the magnitude of the current flowing in a point of the network, each change corresponding to an event, and are able to record in memory the time patterns between events and, optionally, the magnitude changes themselves.

To determine whether there is connectivity between two network points, at least two event detection means must be installed, one "upstream" of the electrical distribution network (connected to the head end of the distribution line), and other "downstream" in the network (connected to a load point).

Figure 1:
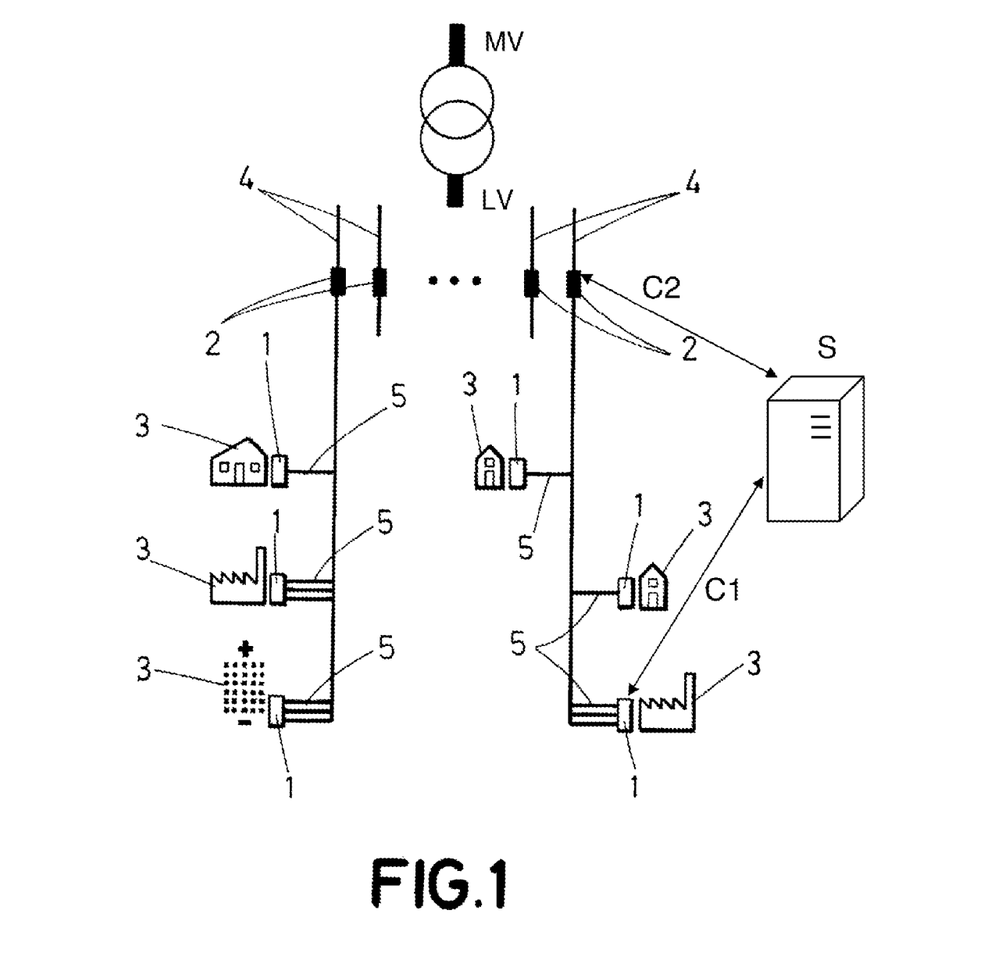
FIG. 1 shows, schematically, the system of the present invention with the first and second event detection means coupled to a low voltage network (LV).

In FIG. 1 a schematic representation of a distribution network of low voltage (LV) comprising a series of electrical distribution lines (4) to which a series of loads (3) at load points (5) are connected is shown.

According to the invention at each load point (5) first event detection means (1) to detect and record time patterns between events generated by loads connected "downstream" of its point of installation and/or the events themselves, are coupled. For a preferred embodiment, the first event detection means (1) installed in the load points (5) record the time patterns between events generated by the loads (3) connected to that load point and, optionally, the events themselves. This first event detection means (1) preferably comprise or are implemented by the current measurement meters installed at each load point that currently allow to measure the power consumption of each customer or user.

As also seen in FIG. 1 second event detection means (2) are coupled to each electrical distribution line (4), said second event detection means (2) allowing to detect events that occur in each line (4), in particular, events generated downstream from their point of installation and the time pattern between events. In this manner, the second event detection means (2) detect a change in a magnitude of the electric current flowing through said electrical distribution lines (4) and the time pattern between several detected events.

Thus, the second event detection means (2) allow to detect the loads connected to that point, which include, if any, those events detected by all the first event detection means (1) connected downstream of its electrical distribution line (4). Second event detection means (2) are, for an embodiment, toroidal current sensors coupled on each line (4).

Preferably the event detection means (1, 2) include storing means for storing the detected events and the time patterns between them, for example in an internal memory of the event detecting means (1, 2).

Figure 2:
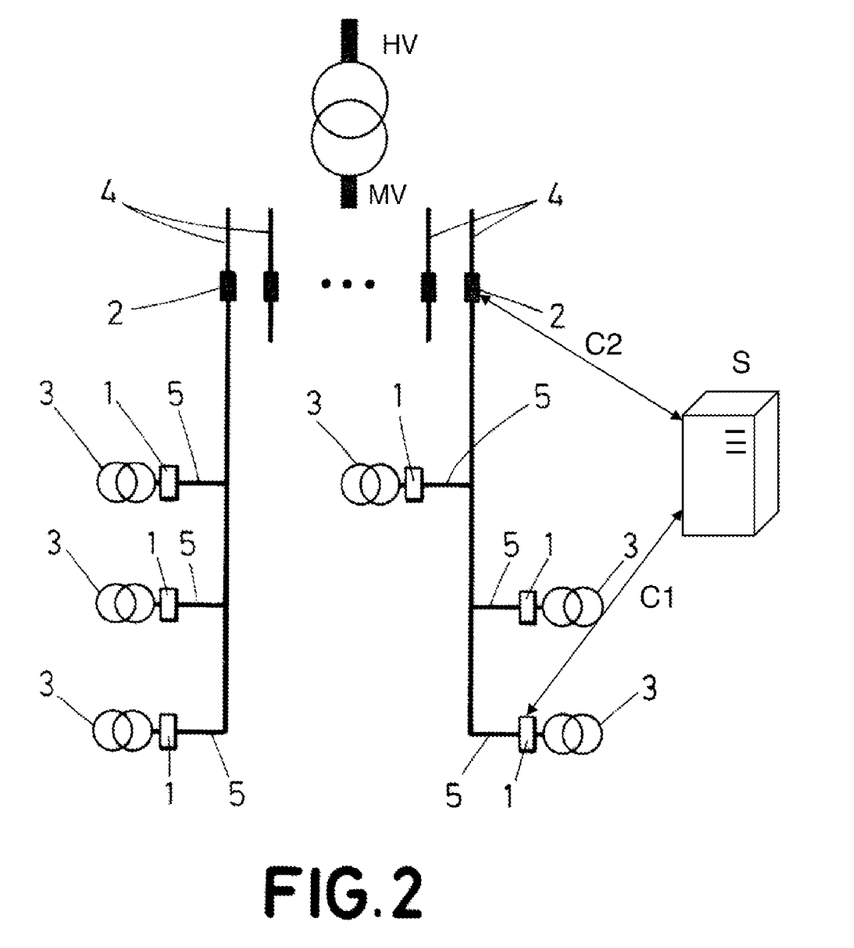
FIG. 2 shows, schematically, the system of the present invention with the first and second event detection means coupled to a network of medium voltage (MV).

FIG. 2 shows a schematic representation of a distribution network of medium voltage (MV) consisting of a series of electrical distribution lines (4) to which a number of transformers (3') are connected at load points (5).

As in the case of low voltage (LV) second event detection means (2) are coupled in each line (4). First event detection means (1) are also coupled to each load point (5) to detect changes in the magnitude of the current flowing, in this case, through each transformer (3') and time patterns between the detected changes, and to record said time patterns and, optionally, the current magnitude changes themselves.

To determine the connectivity between two network points, the time patterns recorded by the second event detection means (2) at the head end of the distribution line (4) must be cross-checked with the time patterns detected by the first event detection means (1) at the load points (5). An algorithm for performing said time patterns cross-checking will be described below.

Complementarily or alternatively to said time pattern cross-checking a cross-checking of the detected events is performed, for a less preferred embodiment.

Those events time patterns corresponding to a certain load point (5) will only be present in the second event detection means (2) that record events time patterns at the head end of the distribution line (4) that distributes electricity to that certain load point (5), and never in other head ends of other distribution lines (4), adjacent conductors, leads, etc.

The second event detection means (2) of the head end of the distribution line (4), contain a chronological record of one or more first event detection means (1) of the load points (5), as many as first event detection means (1) of load points (5) are connected downstream of said distribution line (4).

Both in FIG. 1 and in FIG. 2, the checking processing means (S) (implemented by a computer) has also been depicted, in this case connected only to one of the first event detection means (1) (through connection link C1) and to one of the second event detection means (2) (through connection link C2), for clarity sake. For a preferred embodiment, the checking processing means (5) are connected to all of the first and second event detection means (1, 2). The connection between the checking processing means (S) and the event detection means (1, 2) is intended to collect the data recorded therein, including at least the events time patterns.

Event and event time patterns information can be sent via communication links (C1 and C2 in FIGS. 1 and 2) implementing any of the following technologies: PLC, radio, telephony. ADSL, optical fiber, etc., and even can be collected in situ by an operator.

Afterwards, event tables including events time patterns provided by the first event detection means (1) of customers at the load points (5) are compared with event tables including events time patterns provided by the second event detection means (2) of the head end of the distribution line (4) to determine the connectivity data of the electrical network.

This comparison can be done with an automatic element in the electrical network, i.e. an element with processing capabilities having at least one processor and one memory and also with communication capabilities to receive the above mentioned event tables and process the data included therein (by a computer program or application executable by the at least one processor) to generate a connectivity report or connectivity database including the connectivity data already analyzed, by means of said data processing, and then sending the connectivity report or connectivity database to a remote location, such as the central office of the electrical company supplying electricity through the mentioned distribution lines, or, alternatively, the above mentioned comparison can be done at said central office itself, also automatically by corresponding a computer unit.

Examples of Asynchronous Event Time Patterns Detection in Electrical Networks:

To compare current events between two event detection means that record the current measurements on head end of an electrical distribution network and on a load point of a customer, such as a service entrance point, as already explained above it is preferable to use the temporal information of events instead of the magnitude of the events.

Each of the event detection means of the present invention adds a timestamp to an event that does not have necessarily to match the time stamp added to the same event by another of the event detection means which detects and record said same event, due to the fact that their clocks always will have a temporary error between them.

The value of this temporary error is unknown and in real systems can be of several seconds, minutes or even hours.

Therefore, the next definitions can be stated:

Current event: number (or sequence of numbers) that determines a change in the magnitude of the electrical current when higher than a predetermined threshold.

Timestamp: stamp indicating the instant at which the event detection means detects an event, time referring said event to its internal clock. This clock indicates a relative hour, as it will always have a time shift with respect to an absolute time.

Figure 3:
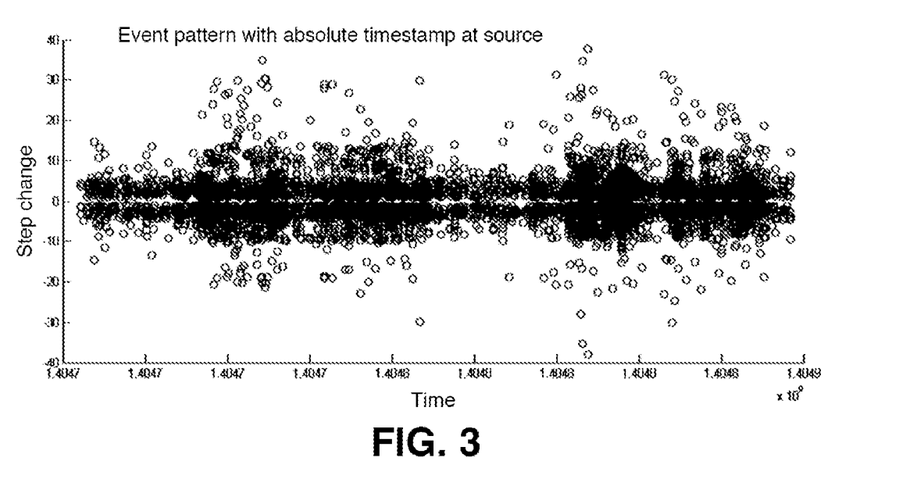
FIG. 3 shows an event time pattern recorded at source, i.e. at a head end of the distribution network.
Figure 4:
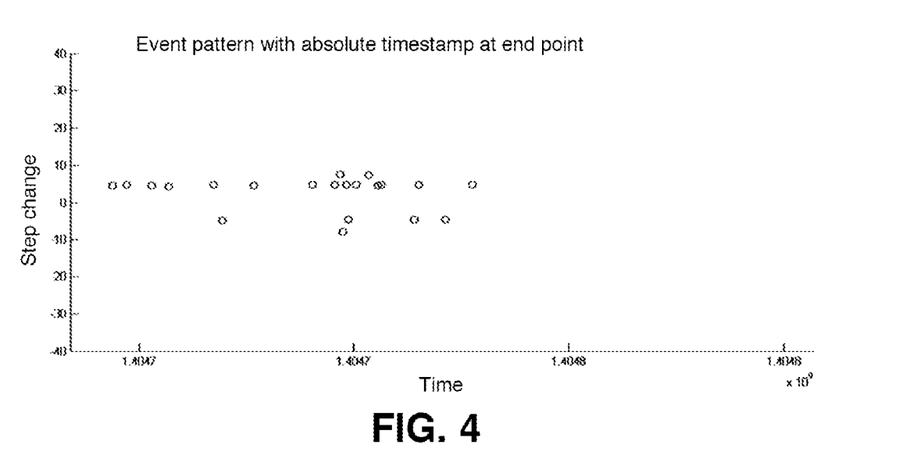
FIG. 4 shows an event time pattern recorded at a load point, particularly to a customer power meter connected to the distribution network.

FIGS. 3 and 4 show, by means of two respective graphs, an embodiment of the present invention regarding two event time patterns: one detected at the head end of the distribution network (source) and another detected at the customer power meter (end point).

Variability in Loads' Amplitudes:

The magnitude of the events measured at the customer load point does not have to coincide with the magnitude of the events detected at the head end of the distribution network, because of the manner in which loads are connected in three-phase distribution systems.

In an electricity distribution network, the electrical current measured at the head end of the network is the result of connecting multiple loads simultaneously, considering how to connect each load and also the power factor of each of said loads. Depending on the type of distribution network, the loads can be single phase, two-phase or three-phase.

Thus, for a given current event, the customer power meter (implementing the first event detection means) will detect said given current event as a change in the electrical current that in amplitude depends on the sum of the current vector with the loads for that customer already connected to the network.

Whereas the measurement system located in the head end, i.e. the second event detection means, will detect said given current event added to events corresponding to the rest of loads connected to the network which said second event detection means is monitoring.

Figure 5:
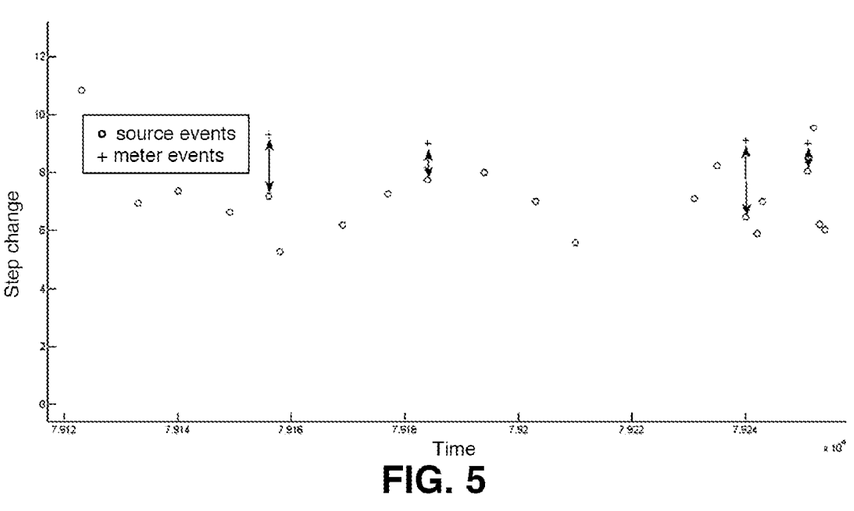
FIG. 5 is a graph which shows, combined, events detected at the source and events detected at the customer power meter, sharing a common time pattern between events.

This causes the magnitude of the increase (or decrease) of the current detected by a customer power meter, is translated at the head end to a value which can be lower in amplitude, as shown in FIG. 5, where "meter events" refer to the events detected by the customer power meter and "source events" to the same events but detected at the head end.

This means that the amplitudes of the detected events have such variability in their magnitudes that makes it difficult to compare the events detected at the head and with the events detected at the customer power meter.

Moreover, in the electrical distribution networks a customer can be supplied with electricity through more than one distribution line simultaneously, thus the electical current consumed at the head end is approximately divided in to the number of lines to which the customer is actually connected.

Also, in networks where there are cogeneration systems the current requested by a given customer may come in a mixed form containing the electricity supplied by the power company transformer and the electricity supplied by the power cogeneration source, in an indeterminate ratio.

Invariance of Time Between Events:

Each event is characterized by the magnitude of the electrical current change and by a timestamp added by the event detection means that detects and records the event.

Figure 6:
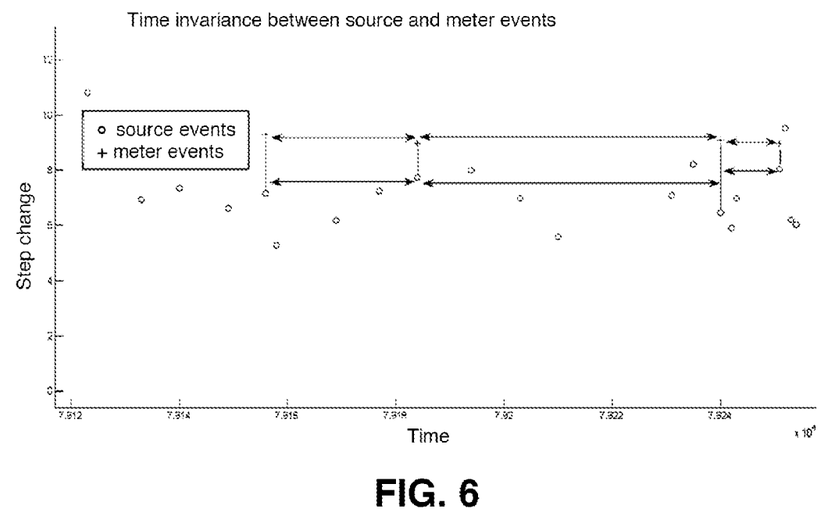
FIG. 6 is a graph that shows the invariance between the time patterns of the meter events with respect to the time patterns of the source events.

FIG. 6 shows an example of the variation between the amplitudes of the events when detected at the customer power meter, i.e. meter events, compared to the same events when detected at the head end, i.e. source events, and of the invariance between the time patterns of the meter events with respect to the time patterns of the source events.

As stated above, the same event can be detected at various locations along the power line with several event detection means having clocks which are not necessarily synchronized with each other. They can record the same event but each assigns its own timestamp referenced to its internal clock.

Thus, for two event detection means, one event will be recorded in the two event detection means with two different time values, due to the time difference of the clocks of the two event detection means.

When a series of events are recorded the same will happen, i.e. each event detection means will reference the events detected thereby adding the time shift that its internal clock has.

The two event detection means will register a very similar events time pattern if the time stamps are taken as relative times rather than as absolute times.

The system, i.e. the connectivity checking processing means, must determine the similarity of two records of events time patterns must take into account the times between events measured by each event detection means, not the absolute time of the events, as the latter will contain absolute errors that in real applications can range from seconds to several minutes, and in some cases even hours.

The best way to counteract the mentioned temporary shift between the clocks is to use the relative time between events of each pattern, since the error of said measurements will be minimum within a time period of one or several days. Said error will only depend on the drift of each clock with himself (e.g. for household power meters, that drift is generally lower than 1 s/day).

If over the graph showing the events time pattern obtained at the head end (for example that of FIG. 3), is overlapped the graph showing the events time pattern obtained at the customer power meter (for example that of FIG. 4), than the latter graph can be slided over the former, along the time abscissa axis, until a significative number of points coincide in time between both graphs when the appropiate time shift is achieved by the mentioned sliding. This time shift, unknown a priori, will coincide with the time difference between the clocks of the two event detection means.

Next the algorithm used, for an embodiment, by the present invention is described.

Said algorithm is implemented by the program code contained by the non-transitory computer-readable storage medium of the present invention, by the program instructions executable by the at least one processor of the connectivity checking processing means of the system of the present invention and also by the memory-loaded program instructions processed by at least one processor according to the method for identifying connectivities in electrical networks of the present invention.

Description of the Algorithm:

Each event i detected by the event detection means of the load point, i.e. of the first event detection means, is characterized by its time stamp meters mts and its event amplitude ma, as follows:

$$mev_i = \{mts_i, ma_i\}$$

A sequence of events rmev produces an events time pattern generated by the loads connected to the customer power meter and having n events, as follows:

$$rmev = \{mev_1, mev_2, \ldots, mev_n\}$$

Similarly, the event detection means arranged at the head end of the network, i.e. of the second event detection means, records event amplitudes ha with their timestamps hts, as follows:

$$hev_i = \{hts_i, ha_i\}$$

Where a sequence of events rhev produces an events time pattern having n events, as follows:

$$rhev = \{hev_1, hev_2, \ldots, hev_n\}$$

In order to compare both events time patterns, first a random time shift dt is added to one of the above two mentioned sequences of events, for example to rmev:

$$mev_{i,dt} = \{mts_i + dt, ma_i\}$$

$$rmev_{dt} = \{mev_{1,dt}, mev_{2,dt}, \ldots, mev_{n,dt}\}$$

Then, a function for comparing both sequences is applied, as follows:

$$y_{dt} =$$

The above function $y_{dt}$, simplified as function y= has the following characteristic:

$$y \to +1 \text{ if } x1 \in x2$$

$$y \to -1 \text{ if } x1 \notin x2$$

In the above function y, the amplitude information ($ha_i$ and $ma_i$) has been normalized for the mentioned events time patterns comparison, although for other embodiment which also includes the comparison of amplitude values, said amplitude information is not normalized as is taken into acount for the comparison.

The algorithm, preferably, executes function y, by iteratively varying the values of dt and, for each dt value, checking if the function gives a result equal to or close to +1. When the relative time error between both events time patterns is found, i.e. when that result equal to or close to +1 is achieved, a positive detection is found.

Figure 7:
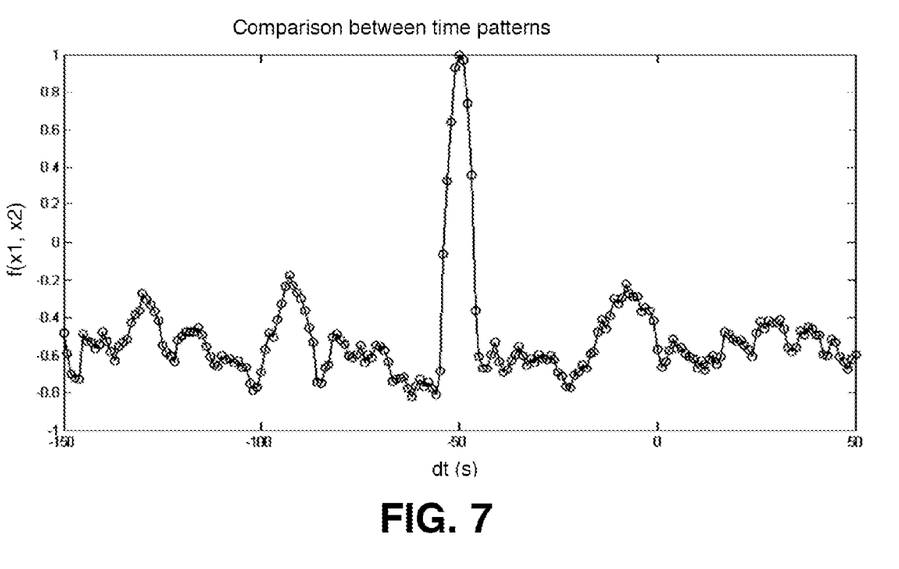
FIG. 7 graphically shows the results of function y (which will be described below) for different values of dt, where said function is iteratively run by an algorithm of the present invention.

FIG. 7 graphically shows the result of function y for different values for dt, where a positive detection has been found for dt=50 s.

In the present specification, the word "comprise" and its variants, such as "comprising" and so on does not have to be interpreted in an exclusive manner, that is, the use of those terms does not exclude the possibility that the invention as described above may include further elements, steps, etc.

Moreover, the invention is not limited to the specific embodiments described but also embraces, for example, variants thereof that can be carried by a person skilled in the art, for example, regarding the choice of materials, dimensions, components, configurations, etc., without departing from the scope of the invention as it is defined in the attached claims.

The invention claimed is:

1. A system for identifying connectivities in electrical networks, comprising:
   first event detection means, including at least one current sensor and at least one clock, and configured and arranged for detecting at least two events defined as changes in a magnitude of a passive electric current circulating through an electrical load point of an electrical network, and the time between said at least two detected events,
   second event detection means, including at least one current sensor and at least one clock, and configured and arranged for detecting at least two events defined as changes in a magnitude of a passive electric current circulating through at least one distribution line of said electrical network and/or through at least one supply point connected to said at least one distribution line to supply electricity therein, and the time between said at least two detected events, and
   connectivity checking processing means, having at least one processor and one memory, and having access to data provided by said first and second event means regarding said times between events, and being adapted to process said provided data, by means of program instructions executable by said at least one processor, to compare the time between the events detected by the first event detection means with the time between the events detected by the second event detection means, and to determine, based on similarity between said compared times, at which distribution line or distribution lines the electrical load point is electrically connected to.

2. The system of claim 1, wherein:
said first event detection means are configured and arranged for detecting a plurality of said events at said electrical load point of an electrical network, and the time pattern followed by said plurality of detected events,
said second event detection means are configured and arranged for detecting a plurality of said events at said at least one distribution line of said electrical network and/or at said at least one supply point connected to said at least one distribution line, and the time pattern followed by said plurality of detected events, and
said connectivity checking processing means have access to data provided by the first and second event means regarding said time patterns, and are adapted to process said provided data to compare said time patterns to determine, based on similarity between said compared time patterns, at which distribution line or distribution lines the electrical load point is electrically connected to.

3. The system of claim 2, wherein:
the first event detection means are configured and arranged for detecting a plurality of said events at each of several electrical load points of an electrical network, and the time patterns followed by said pluralities of detected events,
the second event detection means are configured and arranged for detecting a plurality of said events at each of two or more distribution lines of the electrical network and/or supply points connected to said distribution lines, and the time patterns followed by said pluralities of detected events, and
said connectivity checking processing means have access to data provided by the first and second event means regarding said time patterns, and are adapted to process said provided data to compare said time patterns to determine, based on similarity between said compared time patterns, at which distribution line or distribution lines each of the electrical load points is electrically connected to.

4. The system of claim 3, wherein the system is applied to an electrical distribution network which comprises coupled lines and/or ringed lines, wherein at least one of said electrical load points is connected to two or more of said coupled lines and/or ringed lines, and wherein the second event detection means are configured and arranged for detecting said plurality of events and time patterns between events at said two or more coupled lines and/or ringed lines.

5. The system of claim 3, wherein the second event detection means are configured and arranged for detecting said plurality of events at at least one supply point connected to the head and of the distribution line and at at least another supply point connected to an intermediate point of the same distribution line.

6. The system of claim 1, wherein the first and second event detection means are configured and arranged to detect also the magnitude of the electric current adopted in each event, and wherein the connectivity checking processing means are adapted to compare also the electric current magnitudes detected by the first event detection means with the electric current magnitudes detected by the second event detection means to determine, based on similarity between said compared electric current magnitudes, at which distribution line or distribution lines the electrical load point is electrically connected to.

7. The system of claim 1, wherein the changes in a magnitude of the electric current circulating which define said events are at least one of: changes in their root mean square values and changes in their instantaneous values when longer than 1 ms.

8. The system of claim 1, wherein the first event detection means comprise a power consumption meter installed on the electrical load point or a load meter suitable to be coupled to a transformer of the electrical load point.

9. The system of claim 1, wherein the at least one clock of the first event detection means is independent from the at least one clock of the second event detection means, in order to perform their respective detections of time or times between events.

10. The system of claim 1, wherein the first event detection means and the second event detection means comprise memory storing means for storing in memory the detected events together with corresponding timestamps indicative of the moments at which the events have occurred.

11. The system of claim 1, wherein said electrical load point is one of a service entrance point or a distribution transformer.

12. A method for identifying connectivities in electrical networks, comprising:
detecting at least two events defined as changes in a magnitude of a passive electric current circulating through an electrical load point of an electrical network, and the time between said at least two detected events,
detecting at least two events defined as changes in a magnitude of a passive electric current circulating through at least one distribution line of said electrical network and/or through at least one supply point connected to said at least one distribution line to supply electricity therein, and the time between said at least two detected events, and
processing data regarding said times between events, to compare the time between the events detected at said electrical load point with the time between the events detected at said at least one distribution line of said electrical network and/or said at least one supply point connected thereto, and to determine, based on similarity between said compared times, at which distribution line or distribution lines the electrical load point is electrically connected to, where said data processing is performed by the execution of memory-loaded program instructions by at least one processor.

13. The method of claim 12, comprising detecting also the magnitude of the electric current adopted in each event, and comparing also the electric current magnitudes detected at said electrical load point with the electric current magnitudes detected at said at least one distribution line of said electrical network and/or said at least one supply point connected thereto, to determine, based on similarity between said compared electric current magnitudes, at which distribution line or distribution lines the electrical load point is electrically connected to.

14. The method of claim 12, wherein the changes in a magnitude of the electric current circulating which define said events are at least one of: changes in their root mean square values and changes in their instantaneous values when longer than 1 ms.

15. The method of claim 12, comprising storing in memory the detected events together with corresponding timestamps indicative of the moments at which the events have occurred.

16. A non-transitory computer-readable storage medium, containing program code for causing a computer to perform a method for identifying connectivities in electrical networks comprising processing:
- data regarding time or times between events defined as changes in a magnitude of a passive electric current circulating through an electrical load point of an electrical network, and
- data regarding time or times between events defined as changes in a magnitude of a passive electric current circulating through at least one distribution line of said electrical network and/or through at least one supply point connected to said at least one distribution line to supply electricity therein,
- to compare said time or times between events at said electrical load point with said time or times between events at said at least one distribution line of said electrical network and/or at said at least one supply point connected thereto, and to determine, based on similarity between said compared times, at which distribution line or distribution lines the electrical load point is electrically connected to.

* * * * *